United States Patent

[11] 3,609,471

[72] Inventors Robert I. Scace
Skaneateles;
Glen A. Slack, Scotia, both of N.Y.
[21] Appl. No. 843,533
[22] Filed July 22, 1969
[45] Patented Sept. 28, 1971
[73] Assignee General Electric Company

[54] SEMICONDUCTOR DEVICE WITH THERMALLY CONDUCTIVE DIELECTRIC BARRIER
7 Claims, 2 Drawing Figs.

[52] U.S. Cl. .......... 317/234 R,
317/235 R, 317/234 A, 317/234 G, 317/234 E
[51] Int. Cl. .......... H01l 1/12
[50] Field of Search .......... 317/234
(1), 234 (4), 234 (3); 264/63

[56] References Cited

UNITED STATES PATENTS

| | | | |
|---|---|---|---|
| 3,290,564 | 12/1966 | Wolff, Jr. | 317/234 |
| 3,441,813 | 4/1969 | Takatsuka et al. | 317/234 |
| 3,515,952 | 6/1970 | Robinson | 317/234 |
| 2,887,628 | 5/1959 | Zierdt, Jr. | 317/234 |
| 3,020,454 | 2/1962 | Dixon, Jr. | 317/234 |
| 3,469,017 | 9/1969 | Starger | 174/52 |

*Primary Examiner*—John W. Huckert
*Assistant Examiner*—B. Estrin
*Attorneys*—Robert J. Mooney, Nathan J. Cornfeld, Carl O. Thomas, Frank L. Neuhauser and Oscar B. Waddell

ABSTRACT: A semiconductor device is provided having a metallic heat sink to receive heat generated by internal power losses. Interposed between the semiconductive crystal in which the heat is generated and the heat sink is a thermally conductive dielectric barrier comprised of a unitary layer consisting essentially of aluminum nitride. The aluminum nitride may be in the form of a single crystal or may be polycrystalline. A stress-absorbing soft solder may be located adjacent a surface of the dielectric barrier.

Figure 1:
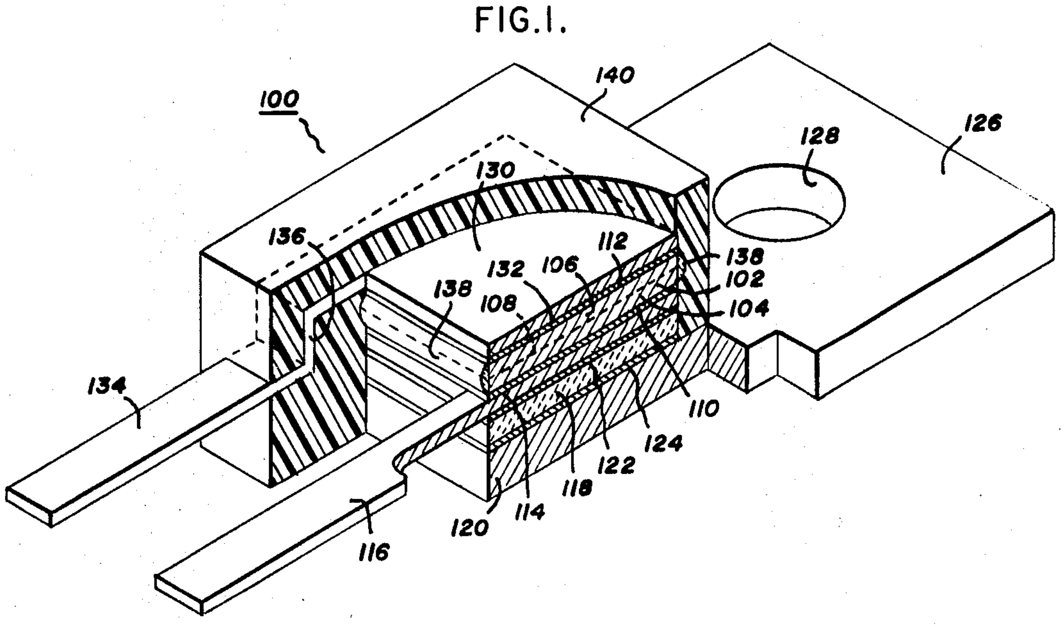

INVENTORS:
ROBERT I. SCACE,
GLEN A. SLACK,
BY Carl O. Thomas
THEIR ATTORNEY.

SEMICONDUCTOR DEVICE WITH THERMALLY CONDUCTIVE DIELECTRIC BARRIER

This invention relates to a semiconductor device capable of transmitting electrical power supplied thereto and efficiently dissipating by means of an electrically isolated heat sink heat, which is formed by passing the electrical current through internal resistances.

In semiconductor devices intended to carry appreciable electrical currents, such as power transistors, rectifiers, thyristors, etc., the device electrical power handling capability may be limited by its ability to dissipate heat generated by internal resistances, since excessive internal temperatures are detrimental to the functioning of the electrically active semiconductive crystal components of the devices.

A common approach to minimizing semiconductive crystal temperatures within devices has been to associate a substantial surface portion of a semiconductive crystal with a highly conductive metallic heat sink which is adapted for ready connection to a device mounting structure, such as a chassis, clamp, or heat exchange device. The heat sink incorporated within the semiconductor device not only acts to transfer heat to the device mounting structure, but also acts as an electrical connection between the associated portion of semiconductive crystal and the mounting structure. Frequently the heat sink also serves as an electrical connector for the device.

In many applications it is either undesirable or inconvenient to have an electrical connection between the semiconductor device and the heat-receiving mounting structure. Accordingly, it has heretofore been proposed to interpose between the semiconductive crystal surface to be cooled and the mounting structure a dielectric barrier which nevertheless is capable of appreciable thermal conduction. Dielectric barriers having relatively high thermal conductivities put to this use have been made from beryllia (BeO) ceramic bodies and from diamond. However, the high cost of diamond has precluded its widespread commercial use, and the commercial use of beryllia has been limited because of its toxicity in particulate form, which materially increases its cost. A wide variety of relatively low-cost dielectric materials have been considered for use in place of beryllia, but have been largely rejected for use because of relatively poor thermal conduction characteristics as compared to beryllia and most commonly employed heat sink metals. For example, whereas beryllia exhibits thermal conductivities in the range of from 2.6 to 3.1 watts per centimeter degree Kelvin, alumina, which is perhaps the most frequently resorted-to low-cost substitute, exhibits a thermal conductivity of only 0.35 watts per centimeter degree Kelvin in monocrystalline form and 0.3 watts per centimeter degree Kelvin in polycrystalline form. The severity of the limitation imposed by alumina can be appreciated by noting that copper, the most widely used semiconductor device heat sink metal, exhibits a thermal conductivity of 4.0 watts per centimeter degree Kelvin.

It is an object of our invention to provide a low-cost, conveniently fabricated semiconductor device having an electrically isolated heat sink and capable of transmitting electrical power at acceptable levels of internal heating.

It is another object to provide a semiconductor device containing a dielectric barrier of improved characteristics in which thermal conduction to and from the dielectric barrier is improved.

These and other objects of our invention are accomplished in one aspect by a semiconductor device capable of conducting a major portion of an electrical current and efficiently dissipating heat formed by passing the electrical current through internal resistances comprised of a semiconductive crystal having spaced first and second areally extended surface portions. First and second metallic current-conducting means are associated with the first and second areally extended portions, respectively. A metallic heat sink is provided for receiving heat generated within the semiconductive crystal and transmitted from one of the areally extended surface portions through the conductively associated current conducting means. A thermally conductive dielectric barrier is interposed between the metallic heat sink and the current-conducting means comprised of a unitary layer consisting essentially of aluminum nitride. Preferably the unitary layer has a density greater than about 80 percent the theoretical density of aluminum nitride, a room temperature thermal conductivity greater than about 0.50 watt per centimeter degree Kelvin and an electrical resistivity greater than $1\times10^{10}$ ohm-centimeters. Additionally, to obtain outstanding thermal conductivities the unitary layer may consist essentially of single phase aluminum nitride and for maximum thermal conductivity the unitary layer should consist essentially of monocrystalline aluminum nitride.

Figure 2:
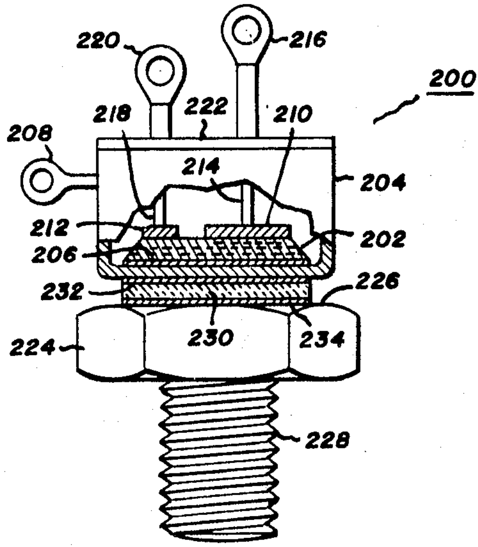

Our invention may be better understood by reference to the following detailed description considered in conjunction with the drawings, in which FIG. 1 is a sectional, perspective view of a semiconductor device constructed according to our invention, and FIG. 2 is an elevation, with portions broken away, of an alternate embodiment.

Noting FIG. 1, a semiconductor device 100 incorporates a semiconductive crystal 102 shown provided with a first zone 104 of a first conductivity type and a second zone 106 of an opposite conductivity type forming a junction 108 therebetween schematically illustrated by a dashed line. The semiconductive crystal is provided with a first major surface 110 and a second major surface 112, which are substantially parallel. As shown the first and second major surfaces form the entire lower and upper surfaces, respectively, of the crystal. Thus the first and second major surfaces account for very nearly all of the exterior surface area of the crystal, since the thickness of the crystal is typically quite small—seldom more than 20 mils. For ease of illustration the crystal thickness is exaggerated in FIG. 1.

Covering the entire first major surface is a highly thermally conductive bonding system 114 schematically shown as a unitary layer joining the crystal to an integrally formed metallic current collector and lead 116. As is conventional practice the current collector and lead is formed of a metal which is both highly thermally and electrically conductive, typically copper. The current collector is sized to underlie the entire first major surface. In a variant form the current collector may underlie most of the first major surface, but be spaced inwardly, except for the lead portion, from the edge thereof.

A dielectric barrier 118 is associated with the underside of the current collector 116. The dielectric barrier may be formed of a unitary body or layer consisting essentially of aluminum nitride, as is more fully described below, or may combine such a unitary body or layer with other conventional thermally conductive dielectrics, such as beryllia and/or alumina. A metallic heat sink 120 is provided having an extended planar surface underlying the dielectric barrier. Bonding systems 122 and 124, which may be identical to bonding system 114, provide a highly thermally conductive heat transfer path from the current collector 116 to the dielectric barrier and from the dielectric barrier to the heat sink, respectively. The heat sink is provided with an integral tab portion 126 laterally offset from the semiconductive crystal and dielectric barrier and containing an aperture 128 to facilitate attachment to a conventional heat-receiving mounting structure. A second integral current collector and lead 130 overlies the semiconductive crystal and is joined thereto by a bonding system 132, which may be identical to bonding systems 114, 120, and/or 124. The current collector overlies the entire second major surface of the semiconductive crystal. In a variant form the current collector may overlie most of the second major surface, but be spaced inwardly, except for the lead portion, from the edge thereof. The lead portion 134 of the current collector is offset at 136 from the plane of the current collector 130 to the plane of the current collector 116, so that the leads of the device are coplanar and substantially parallel to the heat sink. To protect the junction of the semiconductive crystal from contaminants a dielectric passivant layer 138 is provided around the exposed edge of the semiconductive crystal not covered by the bonding systems. The passivant layer is preferably formed of glass, but may be formed of other conventional passivant materials. Surrounding the passivant layer and sealingly associated with the leads and heat sink is a dielectric molded housing, typically formed of a material such as silicone, epoxy, or phenolic resin.

In FIG. 2 a semiconductor device constructed according to our invention is illustrated comprised of a semiconductive crystal 202, which for purposes of description, may be considered to be a four layer, three junction conventional beveled thyristor pellet. The lower (usually anode) major surface of the crystal is joined in thermally and electrically conductive relation to a metallic housing portion or current collector 204 by a bonding system 206, which for ease of illustration is shown as a single layer. A terminal post 208 is conductively associated with the conductive housing portion. An upper contact system 210 and a gate contact system 212 are shown attached to the upper emitter and base layer (usually the cathode emitter and cathode base layers) of the semiconductive crystal over its upper major surface, according to conventional practices. An upper main terminal lead 214 conductively associates the upper contact system with a main terminal post 216 while a gate lead 218 similarly conductively associates the gate contact system with a gate terminal post 220. An insulative housing portion 222 sealingly cooperates with the conductive housing portion and the terminal posts to electrically insulate the gate and cathode terminal posts from the conductive housing portion and to cooperate with the conductive housing portion to hermetically encapsulate the semiconductive crystal.

To facilitate heat removal from the semiconductive crystal a metallic heat sink 224 is provided having a planar surface 226 and a threaded stud 228 for attachment of the device to a conventional heat-receiving mounting structure. To electrically isolate the heat sink from the semiconductive crystal a dielectric barrier 230 is interposed between the planar surface of the heat sink and the conductive housing portion. The dielectric barrier may be identical to dielectric barrier 118. Thermally and electrically conductive bonding systems 232 and 234 join the dielectric barrier to the conductive housing portion and planar surface of the heat sink, respectively.

It is to be appreciated that the semiconductor devices 100 and 200, while representative of preferred structural embodiments, may be varied substantially in construction without departing from our invention. For example, in the semiconductor device 100 instead of utilizing a single-junction semiconductor crystal, as shown, a three-layer two-junction semiconductive crystal of a type conventionally employed in power transistors; a four-layer, three-junction semiconductive crystal of a type conventionally employed in semiconductor controlled rectifiers (SCR's); a five-layer, four-junction semiconductive crystal of a type conventionally employed in commercial triacs; etc. may be substituted. Where a crystal is substituted having a control lead in addition to the power-conducting leads, such lead attachment may be accommodated merely by restricting the surface area of the crystal which the second current collector overlies and providing an additional current collector in laterally spaced relation similarly associated with a control portion of the second major surface in a manner generally well understood in the art. A similar substitution of crystals, including the substitution of a single-junction crystal, could be undertaken in device 200. Using a single-junction crystal the control contact and lead would, of course, be omitted from the device and the main current-carrying contact system 210 extended to cover a larger portion of the upper surface of the crystal. While the semiconductor device 100 is shown provided with an integral lead and current collector construction, it is appreciated that a variety of variant lead and lead attachment techniques are known which may be alternatively employed.

As is well understood in the art, each of the semiconductor devices 100 and 200 is capable of operating in a conducting mode in which electrical power supplied thereto is transmitted internally between the leads or terminal posts. No matter how efficiently the devices are constructed there will always be some slight internal voltage drop in internal power transmission attributable to the resistances of the semiconductive crystals and, to a lesser extent, the leads and the bonding systems. To remove the heat generated from the semiconductive crystals so that their temperature is maintained at an operationally stable level, heat must be conducted from one major surface of each crystal in series through three bonding system, a metallic current collector, a dielectric barrier, and a metallic heat sink. All of these elements, except the dielectric barrier, may be chosen from metals known to exhibit high thermal conductivities. The appreciably lower thermal conductivity of the dielectric barrier thus limits the rate of heat removal from the semiconductor devices and hence the maximum power rating which they can receive.

It is a distinct advantage of our invention that we employ a unitary body or layer of aluminum nitride as a dielectric barrier to electrically isolate electrically conductive portions of a semiconductor device from its heat sink. Aluminum nitride offers the advantage of approaching the exceptionally high thermal conductivities of beryllia and diamond more closely than other known substitutable dielectric materials—e.g., alumina—while avoiding the comparatively high cost and inconveniences of beryllia and diamond.

It has been found that coherent bodies formed from essentially single phase aluminum nitride powders have a highly desirable combination of properties for use as thermally conductive dielectric barriers when the resulting bodies have a density greater than about 80 percent of theoretical (although higher densities are preferred) and the bodies are produced from powders composed of substantially more than 95 percent by weight aluminum nitride. Further, single-crystal bodies of aluminum nitride have even more desirable properties.

For example, hot-pressed bodies approaching theoretical density, but formed from a commercially obtained powder having a reported analysis of minimum aluminum nitride content of 94 percent by weight had a thermal conductivity of only about 0.3 watt per centimeter degree K at room temperature, or lower. Similar bodies having densities of about 97 percent theoretical, but formed from single-phase powders (as determined by X-ray, fluorescence, and diffraction analyses) and being composed of about 99 percent by weight aluminum nitride were found to have thermal conductivities of greater than 0.6 watt per centimeter degree Kelvin at room temperature. A single crystal body of aluminum nitride of moderate purity was found to have a room temperature thermal conductivity of 1.95 watts per centimeter degree Kelvin The electrical resistivity of aluminum nitride has been measured and found to be in excess of $1\times10^{11}$ ohm-centimeters, which is completely adequate for semiconductor device electrical isolation.

In fabricating semiconductor devices according to our invention it is preferred, but not required, that bonding systems be interposed between adjacent layers to improve the thermal conductivities between elements. It is, of course, recognized that in certain device configurations, such as the press pack and compression bonded encapsulation approaches, the use of bonding systems may be reduced or eliminated by applying a compressive force to the opposite major surfaces of the device overlying the stacked elements. In the semiconductor devices 100 and 200 bonding systems are utilized which may be of conventional construction. That is, the bonding systems associated with the semiconductive crystal may be those conventionally associated while the bonding systems associated with the aluminum nitride dielectric barrier may be those heretofore utilized with beryllia or alumina dielectric barriers.

To simplify device construction it will in many circumstances be desirable to utilize an identical bonding system for both the dielectric barrier and the semiconductive crystal. In view of the wide differences between the thermal coefficients of expansion of semiconductive crystals and aluminum nitride bodies or layers, both of which are quite low, and the thermal coefficients of expansion of most heat sink and lead metals, both of which are quite high, a bond between the semiconductive crystal surface or aluminum nitride body and the metallic element adjacent thereto is preferably accomplished utilizing a thin surface metallization on the aluminum nitride or semiconductive crystal surface, which may be one or a plurality of layers, to which a conventional soft solder may be attached, typically a solder having a modulus of elasticity under ambient conditions of less than $1.1\times10$lbs./in.$^2$. The surface metallization assures intimate association of the soft solder with the aluminum nitride body or semiconductive crystal while the soft solder acts to absorb stresses induced by the dissimilar expansion characteristics of the associated elements.

As a specific illustration of a bonding system suitable for use both with the aluminum nitride body and the semiconductive crystal, the opposite major surfaces of the dielectric barrier and semiconductive crystal may be provided with contact metallization by depositing in a vacuum a thin layer of a refractory metal such as chromium, tungsten, or molybdenum followed by a thin layer of nickel which is in turn followed by a thin layer of silver. Chromium, tungsten, and molybdenum refractory metal layers of from 300 to 5,000 Angstroms, nickel layers of from 1,000 to 10,000 Angstroms, and silver layers above 1,000 Angstroms are considered fully satisfactory. A conventional soft solder is then utilized capable of alloying with silver, such as lead-tin, lead-tin-indium, lead-tin-silver, lead-antimony, etc. The soft solder bonds directly to the leads and heat sink as well as the contact metallization.

In a specific application of our invention a semiconductor device was constructed similar to device 100, except that instead of utilizing a single-junction semiconductive crystal as shown a triac silicon crystal was utilized—that is, a five-layer, four-junction silicon crystal of a type employed in commercial triacs. The triac crystal was 8 mils thick (about one-fifth the thickness of a dime) and 150 mils on an edge. An aluminum nitride dielectric barrier was utilized having a thickness of 44 mils and being also 150 mils on an edge. The aluminum nitride body exhibited a density of greater than 80 percent theoretical and resistivity of greater than $1\times10^{11}$ ohm-centimeters. Chromium-nickel-silver surface metallization was applied to the major surfaces of the dielectric barrier and semiconductive crystal in a vapor plater at high vacuum to avoid oxidative contamination of the nickel layer. The chromium layers were bonded directly to the crystal and barrier surfaces and were 1,000 Angstroms in thickness, the overlying nickel layers were 5,000 Angstroms in thickness, and the silver layers overlying the nickel layers were 15,000 Angstroms in thickness. Copper leads and heat sink were employed, the leads being 5 mils in thickness and the heat sink being 54 mils in thickness. A glass passivant was bonded to the edge of the triac crystal and silicone resin was used to form the molded housing. The device was mounted by the tab portion to a heat sink cooled with tap water, and thermocouples were attached to the lead corresponding to lead 116 in FIG. 1 and the heat sink tab portion immediately adjacent the molded housing. Spaced thermocouples were also mounted on the lead and tab portion to allow for corrections due to heat losses therein. In testing four similarly constructed units while conducting 20 watts power under steady state conditions a temperature rise ranging from 1.32 to 1.42 degrees Kelvin per watt across the dielectric barrier and associated bonding systems was noted, with the average temperature rise being 1.35 degrees Kelvin per watt. From this it was apparent that the semiconductor device was capable of useful power transmission capabilities without excessive internal heating and that the aluminum nitride dielectric barrier and associated bonding systems were fully satisfactory for the use to which they had been placed. From the average degrees temperature rise per watt the thermal conductivity of the aluminum nitride dielectric barrier was calculated to be 0.65 watt per centimeter degree Kelvin during device operation.

What we claim and desire to secure by Letters Patent of the United States is:

1. A semiconductor device of transmitting electrical power supplied thereto and efficiently dissipating heat formed by passing electrical current through internal resistances comprising a semiconductive crystal having spaced first and second areally extended surface portions, first and second metallic current conducting means conductively associated with said first and second areally extended surface portions, respectively, a metallic heat sink for receiving heat generated within said semiconductive crystal and transmitted from one of said areally extended surface portions through said conductively associated current conducting means, and a thermally conductive dielectric barrier interposed between said metallic heat sink and said current-conducting means comprised of a unitary body consisting essentially of at least 99 percent weight aluminum nitride, said body having a density greater than about 80 percent the theoretical density of aluminum nitride, a room temperature thermal conductivity greater than about 0.60 watt per centimeter degree Kelvin and an electrical resistivity greater than $1\times10^{10}$ ohm-centimeters.

2. A semiconductor device according to claim 1, including stress absorbing means for intimately bonding said dielectric barrier to said metallic current conducting means and said heat sink in thermally conductive relation therewith.

3. A semiconductor device according to claim 2, wherein said stress-absorbing means is comprised of contact means associated with at least one major surface of said dielectric barrier and a soft solder layer associated with said contact means.

4. A semiconductor device according to claim 1, wherein one of said current-conducting means hermetically encapsulates said semiconductive crystal and said dielectric barrier is associated with an external surface of said hermetically encapsulating conducting means.

5. A semiconductor device according to claim 1, wherein said body is composed of a plurality of particles consisting essentially of single-phase aluminum nitride cohesively bonded together.

6. A semiconductor device according to claim 1, wherein said body consists essentially of monocrystalline aluminum nitride having a room temperature thermal conductivity of at least 1.2 watts per centimeter degree Kelvin.

7. A semiconductor device capable of transmitting electrical power supplied thereto and efficiently dissipating heat formed by passing electrical current through internal resistances comprising a metallic heat sink including a heat dissipation tab and a planar heat-receiving surface laterally displaced therefrom, a thermally conductive dielectric barrier overlying said planar surface comprised of a unitary body consisting essentially of at least 99 percent by weight aluminum nitride, said body having a density greater than about 80 percent the theoretical density of aluminum nitride, a room temperature thermal conductivity greater than about 0.60 watt per centimeter degree Kelvin and an electrical resistivity greater than $1\times10^{10}$ ohm-centimeter, first current-conducting means overlying said dielectric barrier and spaced from said heat sink, a silicon semiconductive means overlying said first current-carrying means and having most of major surface conductively associated therewith, second current-conducting means overlying said silicon semiconductive means and conductively associated with an extended surface portion thereof, metallic solder means providing an intimate thermally conductive bond between said second conductive means and said semiconductive means, said semiconductive means and said first conductive means, said first conductive means and said dielectric barrier, and said dielectric barrier and said heat sink, and dielectric encapsulant means encompassing said semiconductive means and said dielectric barrier and being sealingly associated with said conductive means and said heat sink.

PO-1050
(5/69)

UNITED STATES PATENT OFFICE
CERTIFICATE OF CORRECTION

Patent No. 3,609,471 Dated September 28, 1971

Inventor(s) Robert I. Scace and Glen A. Slack

It is certified that error appears in the above-identified patent and that said Letters Patent are hereby corrected as shown below:

In the claims, Claim 1, Column 5, line 76, after "device" insert -- capable --; Column 6, line 15, after "percent" insert -- by --.

Signed and sealed this 5th day of December 1972.

(SEAL)
Attest:

EDWARD M.FLETCHER,JR.
Attesting Officer

ROBERT GOTTSCHALK
Commissioner of Patents